United States Patent [19]

Frederick et al.

[11] 3,718,841

[45] Feb. 27, 1973

[54] MODULAR RECTIFIER HOLDING ASSEMBLY WITH HEAT SINK SUPPORTING CIRCUIT PROTECTING MEANS

[75] Inventors: Albert R. Frederick, Folsom; Joseph L. Paine; Daniel B. Rosser, both of Springfield, all of Pa.

[73] Assignee: General Electric Company

[22] Filed: July 9, 1971

[21] Appl. No.: 161,229

[52] U.S. Cl. ...........317/100, 317/234 A, 174/DIG. 5

[51] Int. Cl. .................................................H01l 1/12

[58] Field of Search ...317/100, 234; 174/15 R, 16 R, 174/DIG. 5

[56] References Cited

UNITED STATES PATENTS 3,467,897 9/1969 Hoffmann ...........................317/234
3,471,757 10/1969 Sias....................................174/15 R
3,280,389 10/1966 Martin.................................317/234

*Primary Examiner*—Robert K. Schaefer
*Assistant Examiner*—Gerald P. Tolin
*Attorney*—J. Wesley Haubner et al.

[57] ABSTRACT

Disclosed is a modular semiconductor rectifier mounting unit adapted for disposition within a cavity in an insulative supporting structure through which a cooling fluid is passed. The unit includes heat dissipating electrodes which are connected to the cathode and anode terminals of a pair of mounted rectifiers. Termination means are connected to the electrodes and extend in the same direction away therefrom. The termination means are adapted for directly supporting thereon a circuit isolating fuse. A reverse voltage protecting circuit is mounted on the module via a heat dissipating electrode. Frame means are provided disposed about the electrodes to space them from the support structure and to increase the creep distance therebetween.

7 Claims, 4 Drawing Figures

INVENTORS:
ALBERT R. FREDERICK,
JOSEPH L. PAINE,
DANIEL B. ROSSER,
BY Barry A. Stein
ATTORNEY INVENTORS:
ALBERT R. FREDERICK,
JOSEPH L. PAINE,
DANIEL B. ROSSER,
BY Barry G. Stein
ATTORNEY INVENTORS:
ALBERT R. FREDERICK,
JOSEPH L. PAINE,
DANIEL B. ROSSER,
BY Barry A. Stein
ATTORNEY

MODULAR RECTIFIER HOLDING ASSEMBLY WITH HEAT SINK SUPPORTING CIRCUIT PROTECTING MEANS

BACKGROUND AND OBJECTS OF THE INVENTION

This invention relates to semiconductor rectifier holding assemblies, and more particularly it relates to modular semiconductor rectifier holding assemblies.

Various techniques have been proposed for mounting broad area high current semiconductor rectifiers under pressure in heat dissipating assemblies. Such rectifiers are commonly constructed with a broad area semiconductor wafer, having at least one P-N rectifying junction, hermetically sealed in a housing including a ceramic sleeve and a pair of conductive contact terminals which contact the wafer and cap the respective ends of the sleeve. Such rectifiers are held or clamped together by the application of high pressure to their terminal members and no solder or other bonding means are utilized.

In operation the passage of current through the rectifier junction(s) results in the generation of heat therein. Further, the contact resistance between the wafer and the terminals cause the generation of heat upon the passage of current therethrough. Since the current handling capability of a rectifier is temperature limited, it is important to keep the contact resistance at a minimum while efficiently extracting the heat that is generated. In order to accomplish those ends rectifier-holding, heat dissipating assemblies have been constructed with means for applying high pressure evenly over the entire rectifier wafer area to reduce the contact resistance and with heat dissipating elements or fins for radiating the heat which the rectifier generates into a cooling fluid medium. See for example U.S. Pat. Nos. 3,280,389 (Martin) and 3,471,757 (Sias), and U.S. patent application Ser. No. 88,056 (Shore et al) assigned to the same assignee as our invention.

In electric power apparatus composed of plural semiconductor rectifier devices, the rectifiers normally have associated therewith and electrically connected thereto protective and control circuitry. Such circuitry may include isolating fuses and/or current limiting reactors connected in series with the rectifiers and reverse voltage protecting bypass circuits connected in shunt with the rectifiers. A plurality of semiconductor rectifiers, the heat dissipating means mounting them and their associated circuitry may be disposed within a common enclosure or housing and interconnected to form electric power equipment. In order to ensure that the equipment operates within prescribed temperature limits a cooling fluid may be introduced into the enclosure to extract the heat which the rectifiers generate during their operation.

In high power apparatus the interconnections between all of the mounted rectifiers and the associated protective and control circuitry may be somewhat complex and space consuming thereby rendering component accessibility somewhat difficult. In the interests of compactness it is desirable to mount semiconductor rectifier's associated circuitry on its heat dissipating assembly so as to form an integral modular unit which may be electrically interconnected with other such units and supported in a common enclosure to form electric power apparatus such as converters, frequency changers, motor drives etc.

Accordingly, it is an object of our invention to provide a semiconductor rectifier holding-heat dissipating assembly which is adapted to mount the rectifier's associated circuitry thereon to form an integral modular unit.

It is a further object of our invention to provide a mounted rectifier-associated circuitry modular unit which is adapted for simple connection to other such units in a support housing.

It is a further object of our invention to provide a mounted rectifier-associated circuitry modular unit which is adapted for easy insertion in or removal from a support housing.

It is a further object of our invention to provide a mounted rectifier-associated circuitry modular unit which is adapted to provide ready access to said circuitry when said unit is disposed within a supporting housing.

SUMMARY OF THE INVENTION

In carrying out our invention we provide an integral semiconductor rectifier module including at least two heat dissipating electrodes for applying clamping pressure to at least one semiconductor rectifier interposed therebetween. One of said electrodes forms the anode terminal of the rectifier and the other of said electrodes forms its cathode terminal. The electrodes are spaced from one another.

The module is arranged for disposition within a cavity formed by insulating walls of a support housing. The cavity has two open ends through which a cooling fluid may be passed to cool the module disposed therein. When disposed therein peripheral edges of the electrodes are adjacent to the insulating walls of the housing.

In accordance with one aspect of our invention, termination means are connected to the anode and cathode terminals and such means serve as both current conducting means and supporting means for rectifier protecting elements. The termination means comprise a first relatively rigid electrically conductive member connected to the anode terminal and extending toward one end of the cavity when the module is disposed therein and a second relatively rigid electrically conductive member connected to the cathode terminal and extending toward said one end of the cavity when the module is disposed therein. The rigid electrically conductive members are adapted for directly mounting and supporting thereon circuit protecting means such as an electric fuse.

In accordance with another aspect of our invention thyristor reverse voltage protecting bypass circuit means are mounted and supported by a heat dissipating electrode in the path of cooling fluid flow through said cavity.

In accordance with another aspect of our invention a frame member is provided encircling and attached to each of the heat dissipating electrodes to space its peripheral edges from the walls of the cavity. The frame members are separated from one another by a distance greater than the shortest distance between the electrodes.

BRIEF DESCRIPTION OF THE DRAWINGS

Our invention will be better understood and its various objects and advantages will be more fully appreciated from the following description taken in conjunction with the accompanying drawings in which.

DETAILED DESCRIPTION OF THE PREFERRED EMBODIMENT

Figures 1, 2:
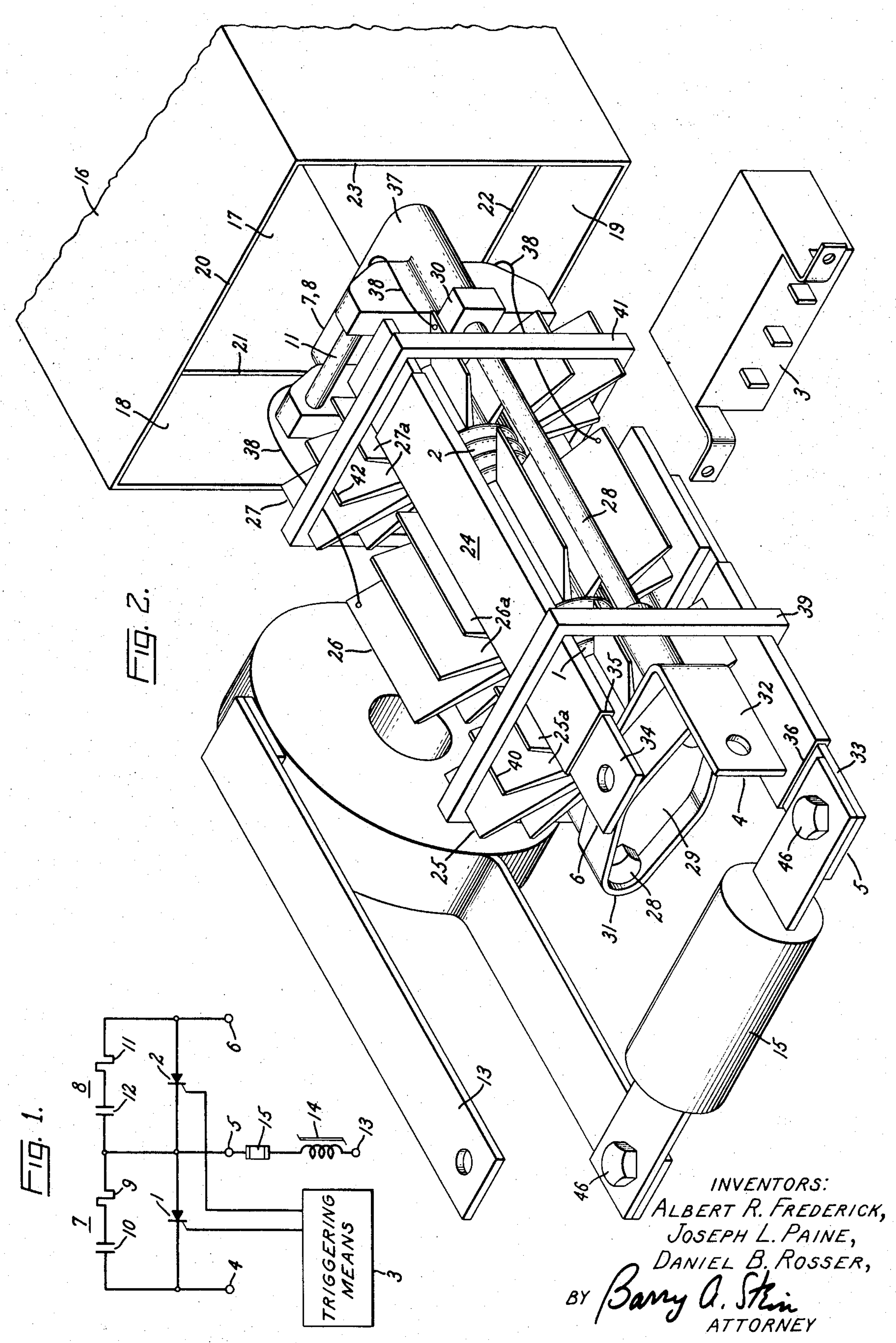
FIG. 1 is a schematic circuit diagram of a portion of a full reversing motor drive.
FIG. 2 is an exploded perspective view of a modular arrangement of the electrical components shown schematically in FIG. 1.

FIG. 1 is a schematic circuit diagram of a portion of a circuit which may be advantageously connected to other such portions to form a full reversing converter drive for a D-C motor such as would be employed in a steel rolling mill.

The circuit portion shown includes a pair of solid-state switching elements 1 and 2, each composed of a single controlled semiconductor rectifier or thyristor. Current conduction in either thyristor is initiated by providing a trigger signal to its gate electrode at a time when its anode is biased positively with respect to its cathode. To that end trigger means 3 is coupled to the gate electrodes of thyristors 1 and 2. The cathode of thyristor 1 is connected to a terminal 4 and its anode is connected to the cathode of thyristor 2 at a common terminal 5. The anode of thyristor 2 is connected to a terminal 6.

In order to protect each of the thyristors from excessive reverse voltages when they turn off, bypass circuit means are connected in shunt with each thyristor. For example, bypass circuit 7 is connected in shunt with thyristor 1 and bypass circuit means 8 is connected in shunt with thyristor 2. Circuit 7 includes a resistor 9 connected in series with a capacitor 10. Similarly, bypass circuit 8 includes a resistor 11 connected in series with a capacitor 12. Each of these bypass circuits, hereinafter referred to as "snubber circuits" is operative transiently to accept reverse current which normally flows through a thyristor as it turns off. In accepting this reverse current the snubber prevents excessive reverse voltage from building up on the thyristor as it abruptly regains its blocking ability at the conclusion of the turn off process. More information about snubber circuits can be found on page 315 of a book by F.E. Gentry et al entitled "Semiconductor Controlled Rectifiers" (published in 1964 by Prentice-Hall, Inc., Englewood Cliffs, New Jersey).

The cathode of thyristor 2 and the anode of thyristor 1 are coupled via a pair of circuit elements (which will be discussed hereafter) to a terminal 13. This terminal is adapted for connection to one phase of a three-phase alternating high voltage source (not shown).

In order to limit the rate of rise of current through thyristor 1 between terminals 4 and 13 when thyristor 1 becomes conductive and to limit the rate of rise of current through thyristor 2 between terminals 13 and 6 when thyristor 2 becomes conductive, a saturable core inductor 14 is connected between the common terminal 5 of thyristors 1 and 2 and the A-C terminal 13. The use of inductors to limit thyristor current is an old and common practice in the art.

In order to isolate the thyristors 1 and 2 from the alternating voltage source in the abnormal event that a fault current begins to flow through either thyristor, a fast acting circuit interrupter or current limiting fuse 15 is connected between the saturable core inductor 14 and the common terminal 5.

FIG. 2 is an exploded perspective view of a physical arrangement of electrical components and associated mounting hardware which can be actually utilized to form the circuit portion shown schematically in FIG. 1. The components and hardware are adapted for disposition as a single module within a compartment of a support structure. A plurality of such modular arrangements may be disposed within similar support structures and interconnected to form electrical converter equipment, such as a full reversing drive for D-C motors.

Support structure 16, which is preferably made of an electrically insulative material, defines three compartments or cavities, namely 17, 18 and 19, in which selected parts of the modular arrangement may be expeditiously disposed. The cavities are formed by the sidewalls of the support structure. For example, sidewalls 20, 21, 22 and 23 define cavity 17. Cavities 17 and 18 are open at both ends (although only one opening of each cavity can be seen in the figures) to enable a cooling fluid to be passed therebetween so as to cool the components disposed in the cavity. Cavity 17 is adapted for housing the basic building block of the arrangement, that is the modular thyristor holding-heat dissipating assembly unit 24. (Module 24 will be described in detail hereafter). Cavity 18 is adapted for housing the current limiting saturable core reactor 14 and cavity 19 is adapted for housing the thyristor triggering means 3.

Figure 3:
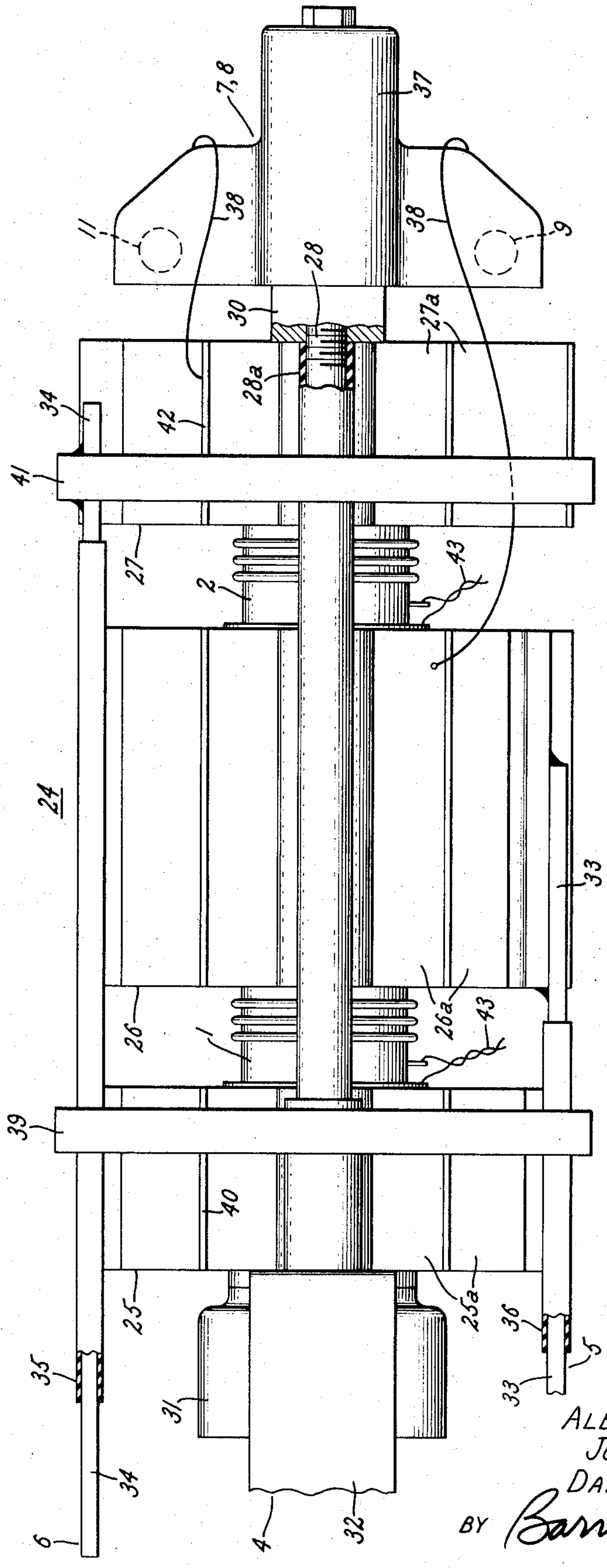
FIG. 3 is a side view of the modular rectifier holding unit shown in FIG. 2.

As shown in FIGS. 2 and 3 module 24 includes a pair of high current thyristors, 1 and 2 which may be of the style shown on pages 349–351 of the General Electric SCR Manual 4th Edition (1967). The thyristors are axially aligned and each comprises a broad area disk!-like semiconductor wafer (not shown) disposed in a ceramic sleeve and sandwiched between a pair of terminals each having an external contact surface thereon. The wafer is characterized by four layers of silicon of alternately P & N type conductivity to form rectifying junctions therebetween. A gate lead is connected to one of said layers.

Each device is disposed mechanically between and connected electrically in series with opposed heat dissipating electrodes which serve as combined electrical and thermal conductors. Toward this end the electrodes are made of a conductive metal such aluminum. As can be seen, thyristor 1 is disposed between two similar heat dissipating electrodes with its cathode contact surface abutting electrode 25 and its anode contact surface abutting electrode 26. Similarly, thyristor 2 is disposed between two heat dissipating electrodes with its cathode contact surface abutting electrode 26 and its anode contact surface abutting electrode 27. Each electrode comprises a solid core (not shown) having a plurality of heat dissipating elements or fins radiating therefrom. For example, electrode 25 includes a plurality of heat dissipating fins 25*a*. Similarly, electrode 26 includes a plurality of heat dissipating fins 26*a* and electrode 27 includes a plurality of heat dissipating fins 27*a*. As should be appreciated with cooling fluid flowing through the cavity 17 between its open ends, the modules' heat dissipating fins will be in the cooling fluid path and the extraction of heat from the rectifiers will be effectuated.

Figure 4:
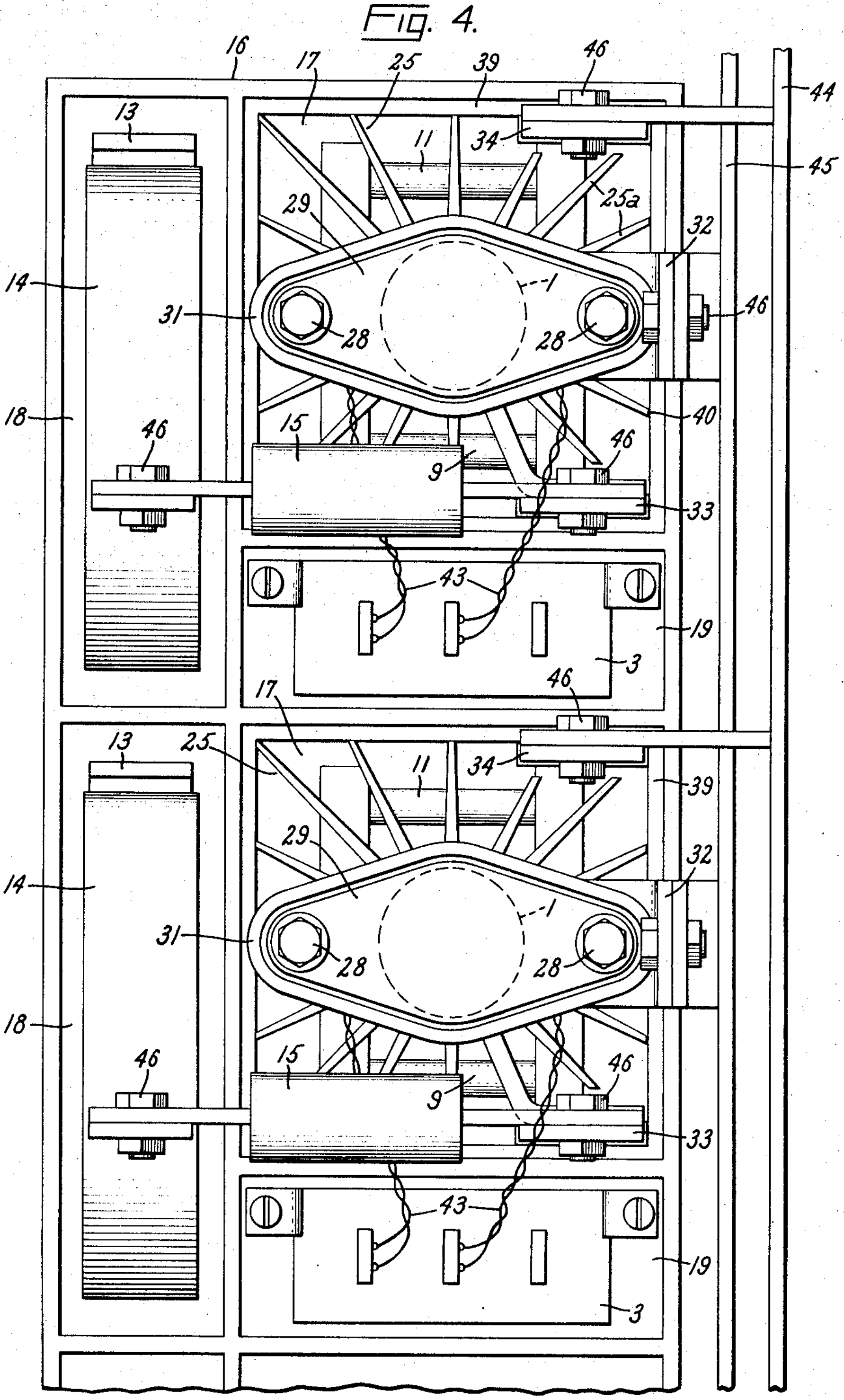
FIG. 4 is a front view of a portion of electrical equipment utilizing plural interconnected modular arrangements.

The anode, cathode and semiconductor wafer of each thyristor are conductively coupled by pressing their contiguous surfaces together under high pressure. This is accomplished by mounting thyristor 1 under pressure between the cores of electrodes 25 and 26 and mounting thyristor 2 under pressure between the cores electrodes 26 and 27. The means for applying the high pressure to the electrodes preferably comprises a tie bolt-leaf spring arrangement. As can be seen in FIGS. 2, 3 and 4 a pair of tension members or tie bolts 28 are disposed parallel to and in the plane of the axis of the thyristors. Coupled to one end of both tie bolts is a resilient member or leaf spring 29. A back up bar 30 is coupled to the other end of the tie bolts. The heat dissipating electrodes 25, 26 and 27 and interposed thyristors 1 and 2 are disposed between leaf spring 29 and back up bar 30. When arranged in this manner the leaf spring transmits a compressive force, which is generated by tightening the tie bolts, to the heat dissipating electrodes, which in turn transfer it to the thyristors sandwiched therebetween. In order to ensure that the compressive force is applied axially on the rectifiers, pivot means (not shown) are disposed between the leaf spring 29 and heat dissipating electrode 25 on the axis of the rectifiers.

The heat dissipating electrode 25 serves as the cathode connection for thyristor 1, the heat dissipating electrode 26 serves as the anode connections for thyristor 1 and the cathode connection for thyristor 2 and the heat dissipating electrode 27 serves as the anode connection for thyristor 2.

In order to preclude arcing between the heat dissipating electrodes they are spaced sufficiently apart from one another to provide an effective strike distance (i.e., the shortest distance through air between the electrodes). In order to preclude a short circuit between electrode 27 and electrode 25 via the tie-bolt-leaf spring clamping means an insulative cup member 31 is disposed between leaf spring 29 (which is electrically connected by the tie bolts to electrode 27) and electrode 25. Further, insulative sleeves 28*a* are disposed about each tie bolt 28 to electrically insulate them from electrodes 25 and 26.

A relatively rigid bus bar 32 is connected to electrode 25 to form terminal 4 which is shown in the schematic circuit diagram of FIG. 1. Similarly a relatively rigid bus bar 33 is connected to electrode 26 to form terminal 5 and a relatively rigid bus bar 34 is connected to electrode 27 to form terminal 6. Each of the bus bars extend away from their associated electrodes in a longitudinal direction with respect to the module and each bus bar terminates at one end thereof so that when the module is disposed within cavity 17 each terminal is adjacent one of the cavities' openings.

The bus bars are relatively rigid in order to be able to support directly thereon thyristor protecting components. For example, as is shown in FIGS. 2 and 4 the current limiting fuse 15 is bolted onto bus bar 33 and is thus supported thereby. Such an arrangement provides a simplified mount for the fuse. Furthermore, when module 24 is disposed within cavity 17 the fuse is readily accessible for servicing without necessitating removal of the entire module from the cavity. This feature can be quite important in reducing servicing "-down time" of the electrical equipment.

In order to insulate bus bar 34 (which is at the anode potential of thyristor 2) from electrode 26 (which is at the cathode potential of thyristor 2) and from electrode 25 (which is at the cathode potential of thyristor 1) we provide an insulating sleeve 35 about bus bar 34. Similarly, an insulating sleeve 36 is provided about bus bar 33 to insulate it from electrode 25 since the bus bar is at the anode potential of thyristor 1 and the electrode is at its cathode potential.

In the furtherance of a compact and readily accessible modular arrangement the "snubber circuits" 7 and 8 are mounted on backup bar 30 so as to form part of module 24. Capacitor 10 of circuit 7 and capacitor 12 of circuit 8 are preferably encapsulated in an electrically insulative potting material 37 for structural as well as electrical reasons. Resistor 9 of circuit 7 and resistor 11 of circuit 8, although encapsulated and supported by the potting material at their ends, have exposed mid-portions. By mounting the resistors in this manner they are in the path of and exposed to the cooling fluid which is passed through cavity 17 to cool the modules' thyristors. Accordingly, the cooling fluid is operative for removing the resistor generated heat as well as the thyristor generated heat.

Owing to the fact that the "snubber circuits" 7 and 8 are mounted on module 24, relatively short electrical leads 38 can be utilized to connect each of the "-snubber circuits" to the heat dissipating electrodes forming the anode and cathode connections of the shunted thyristor. Relatively short leads are desirable from an operating standpoint in that they do not introduce excessive inductance into the "snubber circuits." Excessive inductance in a "snubber circuit" may deleteriously effect its ability to accept transfer of the reverse current which momentarily flows through a thyristor as it turns off.

Since module 24 is designed for disposal in cavity 17 we provide means for increasing the effective distance between the heat dissipating electrodes along the cavity walls (i.e., the creep distance) without increasing the distance separating the electrodes themselves. Thus we are able to provide a compact, rectifier-holding-module 24 having sufficient strike and creep distances between its electrodes to ensure that effective electrode insulation exists. To that end a pair of band-like frame members are utilized. For example, a frame member 39 is disposed about and connected to the peripheral edges 40 of fins 25*a*. Another frame member 41 is disposed about and connected to the peripheral edges 42 of fins 27*a*. Each frame member is sufficiently thick and is spaced from the other by a distance greater than the distance separating the electrodes to which they are connected so that the shortest distance between those electrodes along the insulating walls (i.e., the creep distance) is greater than the shortest air distance between those electrodes (i.e., the strike distance) for any given electrode spacing.

The frame members 39 and 41 also aid in increasing the overall ruggedness of the module by retaining the relatively rigid bus bars 32, 33 and 34 in position.

FIG. 4 shows a portion of electrical equipment utilizing a plurality of the modular units 24 shown in FIGS. 2 and 3. As can be seen, two duplicate modular arrangements are disposed within respective cavities of a pair of stacked support structures. The support structures may be disposed within a cabinet through which a cooling fluid is passed. The components forming each modular arrangement are connected together as shown in FIG. 2. Trigger signals are supplied to the gate electrodes of the mounted thyristors from their associated triggering means 3 via leads 43. The modular arrangements forming the equipment are interconnected via bus bars 44 and 45. Bus bar 44 is utilized to connect all bus bars 34 together. Similarly bus bar 45 is utilized to connect all bus bars 32 together. In the interests of serviceability, bolts 46 are used to connect the bus bars to each other, to the current limiting inductors and to the isolating fuses.

Equipment constructed in accordance with our invention is adapted for quick and efficient servicing in that the inductors and fuses are readily accessible in the support structure so that unbolting them from the bus bars is a quick and simple matter. Further, any rectifier-holding-module(s) itself may be easily and rapidly removed from its cavity, for servicing any of its supported components, by merely unbolting its bus bars from the interconnecting bus bars 44 and 45 and from the fuse or inductor.

It should be appreciated that any number of modular arrangements may be utilized and the modular arrangements so utilized may be interconnected in various manners depending upon the equipment desired. In copending application 48CU00569 (Chandler et at) and assigned to the same assignee of our invention there is disclosed and claimed a novel full reversing motor drive circuit and associated equipment which may advantageously be constructed by interconnecting six of our modular rectifier holding arrangements with circuit interrupting means.

Although module 24 is shown as including two thyristors having a common terminal bus bar 33, it should be apparent to those skilled in the art that the common terminal may be eliminated, in order to provide a module for use in higher voltage arrangements requiring two serially connected thyristors for forming each switching element. With such a modification the fuse 15 and/or inductor 14 may be connected to either terminal 32 or terminal 34 depending upon the equipment desired. The previously described snubber circuits will now serve the additional purpose of transient voltage equalization.

Furthermore, it should be apparent that a single thyristor module can be constructed in accordance with our invention by merely eliminating a thyristor, its associated "snubber circuit," the common heat dissipating electrode 26 and its associated bus bar 33. Such a modification would also require shortening the tie bolts 28.

While we have shown and described a particular embodiment of our invention, it will be obvious to those skilled in the art that various changes and modifications may be made without departing from our invention in its broader aspects; and we, therefore, intend herein to cover all such changes and modifications as fall within the true spirit and scope of our invention.

What I claim as new and desire to secure by Letters Patent of the United States is:

1. In an electric power apparatus including a structure having an open ended cavity through which cavity a cooling fluid is passed, an integral rectifier assembly module having first and second ends disposed within said cavity with said first end thereof adjacent to an open end of said cavity, said module comprising:

a. at least one high current semiconductor rectifier device including a semiconductor body in a sealed housing between a pair of main electrodes having external first and second contact surfaces on opposite sides of the housing;

b. means mounting said device with its main electrodes held under high clamping pressure, said mounting means including
   i. electrically conductive heat dissipating means abutting said first contact surface of said rectifier, and
   ii. force applying means for applying a clamping force axially on said rectifier via said heat dissipating means;

c. circuit protecting means;

d. termination means for electrically connecting said module in a high power electric apparatus, said termination means comprising
   i. a first relatively rigid electrically conductive member connected to said heat dissipating means and extending toward said first end of the module, said first member including an end portion terminating at said first end of the module and
   ii. a second relatively rigid electrically conductive member connected to said second contact surface of said rectifier and extending toward said first end of the module, said second member including an end portion terminating at said first end of the module, one of said rigid members directly supporting at its end portion said circuit protecting means, whereby said circuit protecting means and the end portion of the other rigid member are readily accessible at the open end of the cavity in said support structure.

2. The rectifier assembly module as specified in claim 1 wherein said first and second electrically conductive members are each bus bars having means at their end portions to which said circuit protecting means may be readily connected or disconnected as desired.

3. The rectifier assembly module as specified in claim 2 wherein said circuit protecting means is a fuse.

4. In an electric power apparatus including a support structure having a cavity through which a cooling fluid flows, an integral rectifier assembly module disposed within said cavity in the path of the cooling fluid flow comprising:

a. at least one high current semiconductor rectifier device including a semiconductor body in a sealed housing between a pair of main electrodes having external first and second contact surfaces on opposite sides of the housing;

b. means for mounting said device with its main electrodes held under high clamping pressure, said mounting means including:

c. means for mounting and supporting reverse voltage protecting circuit means on said heat dissipating means with said circuit means in said path of the cooling fluid flow.

5. The rectifier assembly module as specified in claim 4 wherein said reverse voltage protecting circuit means includes a resistor and a serially connected capacitor, said means being electrically connected in shunt with said rectifier.

6. In an electric power apparatus including a support structure having insulating walls forming a cavity therein through which a cooling fluid is passed an integral rectifier assembly module disposed within said cavity and comprising:

a. at least one semiconductor rectifier device including a semiconductor body in a sealed housing between a pair of anode and cathode electrodes;

b. means mounting said device under high clamping pressure, said mounting means comprising:

i. first electrically conductive heat dissipating means abutting said anode electrode;

ii. second electrically conductive heat dissipating means spaced from said first heat dissipating means and abutting said cathode electrode;

iii. force applying means for applying a clamping force axially on said rectifier via said heat dissipating means;

each of said first and second heat dissipating means having peripheral edges which are disposed adjacent the walls of said cavity;

c. a first frame member encircling said first heat dissipating means to space the peripheral edges of said first heat dissipating means from the walls of said cavity; and d. a second frame member encircling said second heat dissipating means to space the peripheral edges of said second heat dissipating means from the walls of said cavity, said second frame member being separated from said first frame member by a greater distance than the distance separating the heat dissipating means.

7. In an electric power apparatus including a support structure having insulating walls forming an open ended cavity through which a cooling fluid is passed an integral rectifier assembly module having first and second ends disposed within said cavity with said first end thereof adjacent an open end of said cavity, said module comprising:

a. at least one semiconductor rectifier device including a semiconductor body in a sealed housing between a pair of anode and cathode electrodes;

b. means mounting said device with its main electrodes held under high clamping pressure said mounting means comprising:

i. first electrically conductive heat dissipating means abutting said anode electrode;

ii. second electrically conductive heat dissipating means spaced from said first heat dissipating means and abutting said cathode electrode; and iii. force applying means for applying a clamping force axially on said rectifier via said heat dissipating means, each of said first and second heat dissipating means having peripheral edges which are disposed adjacent the walls of said cavity;

c. termination means for electrically connecting said module in a high power electric apparatus, said termination means comprising:

i. a first relatively rigid electrically conductive member connected to one of said heat dissipating means and extending towards said first end of the module, said first member including an end portion terminating at said first end of the module; and ii. a second electrically conductive member connected to the other of said heat dissipating means and extending towards said first end of the module, said second member including an end portion terminating at said first end of the module, one of said rigid members directly supporting at its end portion circuit protecting means, whereby said circuit protecting means and the end portion of the other rigid member are accessible at the open end of said cavity;

d. means mounting and supporting reverse voltage-protecting-circuit means on one of said heat dissipating means in the path of the cooling fluid flow through said cavity;

e. a first frame member encircling said first heat dissipating means to space the peripheral edges of said first heat dissipating means from the walls of said cavity; and f. a second frame member encircling said second heat dissipating means to space the peripheral edges of said second heat dissipating means from the walls of said cavity, said second frame member being separated from said first frame member by a greater distance than the distance separating the heat dissipating means.

* * * * *